United States Patent
Koike

(10) Patent No.: US 12,485,478 B2
(45) Date of Patent: Dec. 2, 2025

(54) COPPER PASTE

(71) Applicant: Material Concept, Inc., Sendai (JP)

(72) Inventor: Junichi Koike, Sendai (JP)

(73) Assignee: MATERIAL CONCEPT, INC., Sendai (JP)

( * ) Notice: Subject to any disclaimer, the term of this patent is extended or adjusted under 35 U.S.C. 154(b) by 0 days.

(21) Appl. No.: 18/275,898

(22) PCT Filed: Jan. 19, 2022

(86) PCT No.: PCT/JP2022/001846
§ 371 (c)(1),
(2) Date: Aug. 4, 2023

(87) PCT Pub. No.: WO2022/168610
PCT Pub. Date: Aug. 11, 2022

(65) Prior Publication Data
US 2024/0116105 A1    Apr. 11, 2024

(30) Foreign Application Priority Data
Feb. 5, 2021   (JP) ................. 2021-017286

(51) Int. Cl.
   *B22F 1/107*   (2022.01)
   *B22F 1/102*   (2022.01)

(52) U.S. Cl.
   CPC .............. *B22F 1/107* (2022.01); *B22F 1/102* (2022.01); *B22F 2301/10* (2013.01)

(58) Field of Classification Search
   CPC .......................... B22F 1/102; B22F 2301/10
   See application file for complete search history.

(56) References Cited

U.S. PATENT DOCUMENTS

| | | |
|---|---|---|
| 2014/0367619 A1 | 12/2014 | Summers |
| 2015/0266090 A1* | 9/2015 | Kamikoriyama ...... H05K 1/097 252/512 |

FOREIGN PATENT DOCUMENTS

| | | | |
|---|---|---|---|
| JP | 2008138286 A | 6/2008 | |
| JP | 5450725 B2 | 3/2014 | |
| JP | 2016009829 A | 1/2016 | |
| JP | 2016053216 A | 4/2016 | |
| JP | 6097477 B2 | 3/2017 | |
| JP | 2017123253 A | 7/2017 | |
| JP | 20170122208 A * | 11/2017 | ............ H01B 13/00 |
| JP | 2019077926 A | 5/2019 | |
| JP | 2019099900 A * | 6/2019 | ............... B22F 1/02 |
| JP | 2019214748 A * | 12/2019 | ............... B22F 1/00 |
| JP | 2020020015 A | 2/2020 | |
| JP | 2020164649 A | 10/2020 | |
| WO | 99011407 A1 | 3/1999 | |
| WO | 2014080662 A1 | 5/2014 | |
| WO | 2018179838 A1 | 10/2018 | |

OTHER PUBLICATIONS

EPO Extended European Search Report for corresponding EP Patent Application No. 22749486.1, mailed on Feb. 13, 2024; 7 pages.
International Search Report for International Application No. PCT/JP2022/001846; Date of Mailing, Mar. 29, 2022.
Yonezawa et al., "Low-temperature nanoredox two-step sintering of gelatin nanoskin-stabilized submicrometer-sized copper fine particles for preparing highly conductive layers" RSC Advances, 2015, 5, pp. 61290-61297; Published on Jul. 7, 2015.
SIPO 2nd CN Office Action for corresponding CN Application No. 202280013320.3; Issued Mar. 7, 2025.
JPO Notice of Reasons for Refusal for corresponding JP Application No. 2021-017286; Issued Jun. 3, 2025.

* cited by examiner

*Primary Examiner* — Khanh T Nguyen
(74) *Attorney, Agent, or Firm* — CANTOR COLBURN LLP

(57) ABSTRACT

Provided is a copper paste containing a copper powder and an organic solvent, wherein the organic solvent is an alcohol-based solvent containing one or more first alcohols selected from the group consisting of monohydric and dihydric alcohols having a viscosity at 20° C. of 30-70 mPa·s, and one or more second alcohols selected from the group consisting of dihydric and trihydric alcohols having a viscosity at 20° C. of 300-1000 mPa·s.

13 Claims, No Drawings

COPPER PASTE

CROSS REFERENCE TO RELATED APPLICATIONS

This is the U.S. national stage of application No. PCT/JP2022/001846, filed on Jan. 19, 2022. Priority under 35 U.S.C. § 119(a) and 35 U.S.C. § 365(b) is claimed from Japanese Application No. 2021-017286, filed Feb. 5, 2021, the disclosure of which is also incorporated herein by reference.

TECHNICAL FIELD

The present invention relates to a novel copper paste.

BACKGROUND ART

Conductive paste is used to form wiring for electronic parts, such as chip resistors, chip capacitors, and solar cells or to form wiring on boards for mounting electronic parts, such as boards with through holes. It can also be used to form electrodes or wiring for connection to transistors for controlling display pixel switching and used for power modules for operating electric motors and other devices at high power efficiency. In power modules, if solder is used as a material for bonding semiconductor chips, such as silicon, silicon carbide, or gallium nitride semiconductor chips, to heatsinks, the power modules may fail to achieve high-efficiency operation at high temperature because the solder, which has relatively low thermal conductivity, may hinder dissipation of heat out of the power modules. This means that it is particularly important to use conductive paste for power modules.

At present, many types of conductive paste include silver paste, which has high oxidation resistance. Unfortunately, silver is expensive and tends to cause migration-induced failure of fine-pitch wiring. In recent years, therefore, attempts have been made to use copper paste, which is relatively inexpensive and provides good thermal conductivity. However, copper, although less expensive than silver, has a high tendency to oxidize, and the firing of copper paste needs to use reductive gas, such as hydrogen or formic acid, or inert gas, such as nitrogen, since otherwise copper would oxidize to have reduced dispersion stability or reduced electrical conductivity. For high printability and high wiring density, the copper paste should contain fine copper particles. However, the oxidation problem will be particularly noticeable for such fine copper particles. There are also other problems to be solved, such as relatively low-temperature, short-time firing conditions for process simplification and cost reduction, and bonding strength improvement. To solve those problems, various techniques have been investigated for preventing the oxidation of copper particles and for improving their dispersibility.

For example, Patent Document 1 discloses collagen peptide-coated copper nanoparticles and reports that such copper nanoparticles have high oxidation resistance and high dispersion stability. Patent Document 2 discloses a technique that includes using a mixture of an organic amide solvent, an organic amine solvent, and an alcohol as a solvent component to form a paste containing metal fine particles with improved dispersibility. Patent Document 3 discloses a copper paste including: copper particles with an average particle size of 0.1 to 1 µm; and an alcohol solvent. Non-Patent Document 1 discloses a process including: preparing a paste containing copper fine particles having surfaces coated with a gelatin layer; and subjecting the paste to oxidative annealing in the air and reductive annealing in a $N_2$ gas containing 3% $H_2$ to form a sintered material with low resistivity.

Patent Document 1: Japanese Patent No. 5450725
Patent Document 2: Japanese Patent No. 6097477
Patent Document 3: Japanese Unexamined Patent Application, Publication No. 2016-53216
Non-Patent Document 1: Yonezawa et al., RSC Advances, 2015, 5, 61290-61297 (2015)

DISCLOSURE OF THE INVENTION

Problems to be Solved by the Invention

Unfortunately, when the copper paste disclosed in Patent Document 1 or Non-Patent Document 1 is used, the copper particles may be sintered insufficiently due to the coating of collagen peptide or gelatin on the copper particle surface. This may lead to a problem in that the sintered copper particles may fail to have sufficient mechanical strength for wiring due to weak bonding between the copper particles. In recent years, under the circumstances described above, conductive paste has been required to be capable of being sintered at low temperature in short time and capable of providing high bonding strength (for example, capable of being fired under conditions at 300° C. or less in 10 minutes or less and capable of providing a high bonding strength of approximately 40 MPa or more). Unfortunately, the copper paste disclosed in Patent Document 1 or Non-Patent Document 1 will hardly meet such requirements. When the copper paste described in Patent Document 2 is fired, the organic amide solvent (main solvent) may remain in the wiring layer resulting from the firing and thus cause a reduction in electrical conductivity. The organic amine solvent may also cause an odor, which will raise the problem of worsened working conditions. When the paste described in Patent Document 3 is used, the copper particles may be insufficiently protected from oxidation during firing, and some problems may occur, such as changes in viscosity caused by low-boiling point solvent volatilization during storage and high-boiling point solvent residue.

It is an object of the present invention, which has been made in view of the problems described above, to provide a copper paste exhibiting high oxidation resistance, high storage stability, and high workability and being capable of providing high electrical conductivity and high thermal conductivity, specifically to provide a copper paste capable of being fired at low temperature in short time and capable of providing high bonding strength.

Means for Solving the Problems

As a result of intensive studies, the inventor has created a copper paste containing a combination of two or more different alcohols as a dispersion medium and has completed the present invention based on findings that such a copper paste has high workability, exhibits no change in viscosity during storage, and is less likely to undergo oxidation of copper particles during firing. Specifically, the present invention is directed to a copper paste according to any one of aspects (1) to (7).

(1) A copper paste including copper particles; and an organic solvent,
  the organic solvent being an alcohol-based solvent including:

at least one first alcohol selected from the group consisting of monohydric and dihydric alcohols having a viscosity of 3 mPa·s or more and 70 mPa·s or less at 20° C.; and at least one second alcohol selected from the group consisting of dihydric and trihydric alcohols having a viscosity of 300 mPa·s or more and 1,000 mPa·s or less at 20° C.

(2) The copper paste according to aspect (1), wherein the first alcohol has a boiling point of 150° C. or more and 240° C. or less at atmospheric pressure, wherein the second alcohol has a boiling point of 190° C. or more and 320° C. or less at atmospheric pressure, and wherein the boiling point of the first alcohol is lower than that of the second alcohol.

(3) The copper paste according to aspect (1) or (2), wherein the organic solvent has a ratio (X/Y) of the mass (X) of the first alcohol to the mass (Y) of the second alcohol of 0.2 or more and 8.0 or less.

(4) The copper paste according to any one of aspects (1) to (3), wherein the first alcohol is at least one alcohol selected from the group consisting of 1-hexanol, 1-heptanol, 2-heptanol, 1-octanol, 2-octanol, 2-ethyl-1-hexanol, benzyl alcohol, hexylene glycol, 1,2-propanediol, 1,3-propanediol, and ethylene glycol, and wherein the second alcohol is at least one alcohol selected from the group consisting of 2-ethyl-1,3-hexanediol and glycerol.

(5) The copper paste according to any one of aspects (1) to (4), wherein the copper paste is substantially free of any resin component.

(6) The copper paste according to any one of aspects (1) to (5), wherein the copper particles have a coating layer on at least part of their surface, and the coating layer includes at least one compound selected from the group consisting of a polysaccharide and a fatty acid.

(7) The copper paste according to aspect (6), wherein the copper particles having the coating layer contain 0.05 mass % or more and 0.8 mass % or less of carbon and 0.05 mass % or more and 1.5 mass % or less of oxygen based on 100 mass % of the copper particles.

Effects of the Invention

The present invention provides a copper paste that exhibits high oxidation resistance, high storage stability, and high workability and is capable of providing high electrical conductivity and high thermal conductivity. The copper paste of the present invention is also capable of being fired at low temperature in short time and capable of providing high bonding strength.

PREFERRED MODE FOR CARRYING OUT THE INVENTION

Hereinafter, embodiments of the present invention will be described. It should be noted that the embodiments described below are not intended to limit the present invention.

The present invention is directed to a copper paste including: copper particles; and an organic solvent, the organic solvent being an alcohol-based solvent including:

at least one first alcohol selected from the group consisting of monohydric and dihydric alcohols having a viscosity of 3 mPa·s or more and 70 mPa·s or less at 20° C.; and at least one second alcohol selected from the group consisting of dihydric and trihydric alcohols having a viscosity of 300 mPa·s or more and 1,000 mPa·s or less at 20° C.

A key feature of the present invention is the use of an organic solvent including a combination of two or more different alcohols as a dispersion medium. This feature makes it possible to provide a copper paste that has high workability, exhibits no change in viscosity during storage, and is less likely to undergo oxidation of copper particles during firing. As used herein, the term "viscosity" with respect to the organic solvent means the viscosity at any shear rate since the organic solvent is a Newtonian viscous fluid with a viscosity independent of shear rate. On the other hand, the term "viscosity" with respect to the copper paste means the viscosity of the copper paste measured at a shear rate of 1 sec$^{-1}$ using a cone-plate dynamic viscoelasticity analyzer (e.g., RST Cone Plate Rheometer manufactured by Brookfield). Hereinafter, each of the components of the copper paste of the present invention will be described in detail.

Alcohol-Based Solvent

The organic solvent in the copper paste of the present invention is an alcohol-based solvent, which includes a combination of two or more of monohydric, dihydric, and trihydric alcohols having different viscosities as specified above. If the alcohol-based solvent includes a tetrahydric or polyhydric alcohol (with a valence of 4 or more), the alcohol may remain in a sintered product, in particular, resulting from firing at a low temperature of approximately 300° C. or less in a reducing atmosphere or a nitrogen atmosphere and may cause a reduction in electrical conductivity or bonding strength. If the alcohol-based solvent includes only a monohydric alcohol, the alcohol can easily volatilize during the storage or printing of the copper paste so that a change in copper paste viscosity may occur to raise the problem of a reduction in workability. The use of a combination of alcohols with the viscosities specified above according to the present invention makes it possible not only to avoid such problems but also to provide a copper paste containing uniformly dispersed copper particles and having excellent physical properties and workability. In particular, the use of the second alcohol, which has a relatively high viscosity, makes it possible not only to prevent the applied paste from sagging, which would otherwise cause a deviation from the desired shape, but also to control the viscosity of the copper paste to an appropriate value even in the absence of any binder component, such as a resin, as described later. The copper paste containing no resin component can be fired at relatively low temperature in a non-oxidating atmosphere, with no need to take into account the possibility of formation of resin component-derived carbon residues.

As used herein, the term "alcohol-based solvent" means an alcohol-based mixed solvent, which is intended to also include mixed solvents containing a small amount of water and/or, for example, about 1 to 20 mass %, specifically, about 5 to 10 mass % of ether, ketone, ester, or any other organic solvent in addition to the alcohols. The alcohol-based solvent may also contain any other solvent, such as a hydrocarbon solvent or a halogenated hydrocarbon solvent. Preferably, however, the alcohol-based solvent should be free of a nitrogen-containing solvent, such as amine or amide, or should contain only at most about 5 mass % of the nitrogen-containing solvent since the nitrogen-containing solvent tends to remain in dried products. The total mass of the first and second alcohols preferably makes up 70 mass % or more, more preferably 80 mass % or more, even more preferably 90 mass % or more, furthermore preferably 95 mass % or more of the total mass of all solvents in the copper paste. Increasing the content of the alcohols, especially increasing the content of the trihydric alcohol, which has a reducing action, in the copper paste solvent will help to prevent oxidation of copper particles more effectively.

In the present invention, while the first and second alcohols may each be any type having the valence and viscosity specified above, they are preferably alcohols having a boiling point of 150° C. or more. As used herein, the term "boiling point" means the boiling point at atmospheric pressure unless otherwise specified. An alcohol with a boiling point of less than 150° C. may undergo bumping during heating so that voids may form in the paste to deteriorate the ability of the paste to be sintered. On the other hand, the use of an alcohol with a boiling point of 150° C. or more will eliminate such a problem during the firing of the copper paste and make it possible to provide a sintered product with higher electrical conductivity and higher thermal conductivity. The use of an alcohol with a boiling point of 150° C. or more will also prevent the copper paste from undergoing a solvent volatilization-induced change in viscosity in a short time even during storage at room temperature. This will also eliminate the need for refrigeration or freezing and help to reduce the storage cost.

The second alcohol is preferably selected so as to have a boiling point higher than that of the first alcohol so that the copper particle oxidation-preventing effect of the present invention will be more remarkable. The use of the first alcohol, which has relatively low viscosity, allows the copper paste of the present invention to have an appropriate level of viscosity and good workability. After the copper paste is applied, however, there is no need to control its viscosity, and it is rather preferred that the first alcohol be allowed to dissipate for the prevention of copper paste sagging. On the other hand, the concentration of the second alcohol should preferably be high during the firing of the copper paste since the second alcohol includes the dihydric alcohol and/or the trihydric alcohol, among which the trihydric alcohol especially has a high reducing action. Thus, in a case where the second alcohol in the copper paste has a boiling point higher than that of the first alcohol and vaporizes at a temperature close to the copper paste firing temperature, the copper paste will maintain good workability and be more effectively prevented from undergoing copper particle oxidation. In a more preferred embodiment of the present invention, the boiling point of the first alcohol should be 150° C. or more and 250° C. or less (in particular 240° C. or less), and the boiling point of the second alcohol should be 190° C. or more and 320° C. or less.

While the content of the first and second alcohols in the copper paste of the present invention may be any level, the organic solvent preferably has a ratio (X/Y) of the mass (X) of the first alcohol to the mass (Y) of the second alcohol of 0.2 or more and 8.0 or less, more preferably 0.5 or more and 5.0 or less. The copper paste should be printed to form a substantially uniform-thickness layer at the interface between a chip and a board so that the copper paste can provide a sufficient level of bonding strength (e.g., die shear strength between the chip and the board). When the ratio defined above is 0.2 or more, the copper paste will tend to have appropriate viscosity and provide sufficient bonding strength. When the ratio is 8.0 or less, the copper paste can undergo sufficient reduction and be sintered particularly well to provide high electrical conductivity and high bonding strength. In order for the copper paste to have a normal viscosity, the content of the organic solvent (alcohol-based solvent) in the copper paste is preferably 5 mass % or more and 40 mass % or less, more preferably 8 mass % or more and 20 mass % or less, based on 100 mass % of the total mass of the copper paste, while it may be any suitable level selected depending on the desired copper paste viscosity. With a solvent content of approximately 5 mass % or more, the copper paste can be spread as a uniformly thick layer over the interface to provide high bonding strength. With a solvent content of approximately 40 mass % or less, the copper paste can be fired with no solvent reside and thus with no reduction in electrical conductivity or bonding strength.

First Alcohol

In the present invention, as defined above, the first alcohol is at least one alcohol selected from the group consisting of monohydric and dihydric alcohols having a viscosity of 3 mPa·s or more and 70 mPa·s or less. The copper paste containing the first alcohol with a viscosity in this range can be easily applied with ensured good workability. The first alcohol preferably has a boiling point of 150° C. or more. The first alcohol more preferably has a boiling point more than 50° C. lower than the temperature at which the copper paste is to be fired. The temperature at which the copper paste is to be fired is typically, but not limited to, around 250 to 300° C. for common bonding applications. In the present invention, therefore, the first alcohol preferably has a boiling point of 150° C. or more and 250° C. or less, more preferably 150° C. or more and 240° C. or less, even more preferably more than 150° C. and 230° C. or less, furthermore preferably 170° C. or more and 200° C. or less. Moreover, at around room temperature (e.g., at 20° C.), the first alcohol preferably has a vapor pressure of 0.1 Pa or more and 100 Pa or less, more preferably 1 Pa or more and 50 Pa or less, even more preferably 3 Pa or more and 30 Pa or less, for better storage stability and better workability. Examples of the first alcohol with such properties include, but are not limited to, monohydric alcohols such as 1-hexanol (viscosity: 4.58 mPa·s, boiling point: 158° C., vapor pressure: 80 Pa), 1-heptanol (viscosity: 5.81 mPa·s, boiling point: 176° C., vapor pressure: 44 Pa), 2-heptanol (viscosity: 3.96 mPa·s, boiling point: 159° C., vapor pressure: 78 Pa), 1-octanol (viscosity: 7.29 mPa·s, boiling point: 195° C., vapor pressure: 24 Pa), 2-octanol (viscosity: 6.49 mPa·s, boiling point: 180° C., vapor pressure: 42 Pa), 2-ethyl-1-hexanol (viscosity: 6.27 mPa·s, boiling point: 185° C., vapor pressure: 35 Pa), and benzyl alcohol (viscosity: 5.47 mPa·s, boiling point: 205° C., vapor pressure: 18 Pa); and dihydric alcohols such as ethylene glycol (viscosity: 16.1 mPa·s, boiling point: 197° C., vapor pressure: 20 Pa), 1,2-propanediol (viscosity: 40.4 mPa·s, boiling point: 188° C., vapor pressure: 28 Pa), 1,3-propanediol (viscosity: 47 mPa·s, boiling point: 214° C., vapor pressure: 5 Pa), 2,3-butanediol (viscosity: 45 mPa·s, boiling point: 182° C., vapor pressure: <100 Pa), and hexylene glycol (viscosity: 34.4 mPa·s, boiling point: 197° C., vapor pressure: 19 Pa). The first alcohol may be a mixture of two or more of these alcohols. All the viscosities and vapor pressures shown above are the values at 20° C. or 25° C. Specifically, in the present invention, the first alcohol is preferably 1-octanol, 2-octanol, 2-ethyl-1-hexanol, ethylene glycol, 1,2-propanediol, or hexylene glycol. The first alcohol, which has relatively low viscosity as shown above, can be added in a smaller amount to form a copper paste with an appropriate level of viscosity. This means that the use of the first alcohol will help to reduce the total organic solvent content of the copper paste and to reduce the organic solvent component residue during firing.

Second Alcohol

In the present invention, as defined above, the second alcohol is at least one alcohol selected from the group consisting of dihydric and trihydric alcohols having a viscosity of 300 mPa·s or more and 1,000 mPa·s or less. Without reducing the workability of the copper paste, the second alcohol with a viscosity in such a range can prevent sagging of the copper paste to be sintered, which would otherwise make it impossible to form a desired shape. The second alcohol preferably has a boiling point of 190° C. or more. More preferably, the second alcohol has a boiling point at least 50° C. lower than the temperature at which the copper paste is to be fired. In view of the usual copper paste firing temperature, the boiling point of the second alcohol is preferably 200° C. or more, more preferably 240° C. or more. The upper limit of the boiling point is preferably, but not limited to, 320° C. or less, more preferably 300° C. or less, in view of workability, the heat resisting temperature of the application target, such as a board, and other factors. The alcohol with a boiling point in such a range will not remain in spaces between copper particles even in a sintered product resulting from firing at low temperature and thus will not cause a reduction in electrical conductivity. Moreover, the second alcohol preferably has a vapor pressure of 1 mPa or more and 5 Pa or less, more preferably 1.5 Pa or less, even more preferably 1 Pa or less, at around room temperature (e.g., at 20° C.), which will allow the copper paste to have higher storage stability and to be more resistant to oxidation during firing. This advantageous effect will be particularly noticeable when the second alcohol has a vapor pressure lower than that of the first alcohol. Examples of the second alcohol with such properties include, but are not limited to, dihydric alcohols such as 2-ethyl-1,3-hexanediol (viscosity: 323 mPa·s, boiling point: 244° C., vapor pressure: <1.4 Pa); and trihydric alcohols such as glycerol (viscosity: 934 mPa·s, boiling point: 290° C., vapor pressure: 0.01 Pa). The second alcohol may be a mixture of these alcohols.

Copper Particles

The copper particles in the copper paste of the present invention may be any type, examples of which include various commercially available products. In the present invention, however, the content of non-copper elements in the copper particles is preferably 1 mass % or less based on the total mass of the copper particles, which corresponds to 100 mass %. Non-copper elements, specifically metal elements, may segregate on the copper particle surface or form oxides to deteriorate the sintering properties and may form a solid solution in copper particles to cause the sintered product to have reduced electrical conductivity. When the content of non-copper elements, specifically As, Co, Cr, Fe, Ir, P, S, Sb, Se, Te, Ti, V, and Zr, in the copper particles is 1 mass % or less, the copper paste can be sintered into a product with an electrical resistivity of approximately 5 µΩcm or less and a thermal conductivity of approximately 130 W/m·K or more. The sintered product with such a level of thermal conductivity enables efficient dissipation of heat, for example, generated in a power module, to the outside. The content of impurities, specifically the above elements, in the copper particles is more preferably 0.5 mass % or less so that an electrical resistivity of approximately 4 µΩcm or less and a thermal conductivity of approximately 167 W/m·K or more can be achieved.

The copper particles with such properties can be produced by, for example, the high-pressure water atomization method described in PCT International Publication No. WO99/11407 or the wet chemical reduction-precipitation method described in PCT International Publication No. WO2014/80662. The high-pressure water atomization method is a method for producing metal particles (e.g., copper particles) from molten metal, which includes passing a dropping flow of molten metal through a central portion of a nozzle with a gas flowing therethrough; atomizing the dropping flow of molten metal with the gas flow near the outlet of the nozzle to form molten metal particles; and then further atomizing the molten metal particles with a liquid being spayed in an inverted cone shape. In this method, gas atomization and liquid atomization are continuously performed on the molten metal to form spherical or granular particles with very small sizes. Thus, this method makes it possible to produce low-oxygen-content metal particles (e.g., copper particles) at industrially large scale and low cost. The wet chemical reduction-precipitation method includes performing wet chemical reduction of copper ions using a reducing agent, such as hydrazine, and an organic solvent that is compatible with water and capable of reducing the surface tension of water. Specifically, the wet chemical reduction-precipitation method includes mixing, in a liquid medium of water and the organic solvent, the reducing agent and a reactant liquid containing monovalent or divalent copper ions to reduce the copper ions to copper particles. In general, the high-pressure water atomization method can produce particles with sizes of 0.7 µm or more. The wet chemical reduction-precipitation method is suitable for producing fine particles with sizes of 0.7 µm or less.

The copper particles (copper powder) preferably have an average particle size of 0.05 µm or more and 2.0 µm or less. With an average particle size of 2.0 µm or less, the copper particles will have a relatively large surface area and tend to be easy to sinter at low temperatures. On the other hand, with an average particle size of less than 0.05 µm, the copper particles may be expensive for use as a raw material, and the copper wiring formed by the method according to the present invention may tend to fail to be an inexpensive alternative to silver wiring. With an average particle size of less than 0.05 µm, the copper particles may also aggregate in a large number and tend to have sintering properties substantially as low as those of coarse paste particles. As used herein, the term "average particle size" refers to 50% particle size ($d_{50}$), which corresponds to the median of the particle size distribution measured using, for example, a laser particle size distribution analyzer. The copper particles to be used more preferably have an average particle size of 0.08 µm or more and 1.0 µm or less, even more preferably 0.3 µm or more and 0.7 µm or less.

The copper particles (copper powder) may have on their surface, a coating material that will not affect the sintering properties. In the present invention, however, the copper particles are preferably free of a gelatin coating layer such as that disclosed in Non-Patent Document 1 because such a gelatin coating layer tends to cause insufficient sintering. In the present invention, the copper particles preferably have on at least part of their surface, a coating layer including a polysaccharide or fatty acid compound. Polysaccharide molecules can form a hydrophilic coating on the exterior of the copper particle (which is to be in contact with the solvent) and thus can interact with the hydroxyl group of the organic solvent in the copper paste to provide an appropriate level of viscosity. On the other hand, the carboxyl group of the fatty acid can bind to the copper particle surface to increase the dispersibility of the copper particles due to the opposite hydrophobic end of the fatty acid and thus to hinder the aggregation of the particles. These actions of the polysaccharide and fatty acid will enable the copper paste to spread with a uniform thickness over the interface and to provide high bonding strength. Examples of the polysaccharide include, but are not limited to, gum arabic, carboxymethylcellulose, hydroxyethylcellulose, cellulose nanofibers, starch, glycogen, agarose (agar), pectin, and alginic acid, and their salts. The polysaccharide may also be a sulfur-containing polysaccharide, such as carrageenan. Among them, gum arabic and sodium alginate are particularly preferred. Examples of the fatty acid include medium chain fatty acids, such as pentanoic acid, octanoic acid, nonanoic acid, decanoic acid, dodecanoic acid, and tetradecanoic acid, among which octanoic acid, nonanoic acid, and decanoic acid are particularly preferred.

While the rate of surface area coverage by the coating layer may be any level, the copper particles are preferably covered with the coating layer at such a level that the copper particles with the coating layer have a carbon content of 0.05 mass % or more and 0.8 mass % or less and an oxygen content of 0.05 mass % or more and 1.5 mass % or less based on 100 mass % of the total mass of the particles. With a carbon or oxygen content of less than 0.05 mass %, the copper particles may be less likely to have surfaces with a sufficient level of polysaccharide molecule-derived hydrophilicity, so that the copper paste may have a low viscosity, which may make it difficult to form a uniform paste layer and cause a reduction in bonding strength. With a carbon content of more than 0.8 mass % or an oxygen content of more than 1.5 mass %, for example, the copper particles may form a sintered product containing a carbon- or oxygen-containing component residue during firing in a nitrogen atmosphere, which may cause a reduction in electrical conductivity or bonding strength. More preferably, the coverage level is such that the particles have a carbon content of 0.1 to 0.5 mass % and an oxygen content of 0.1 to 1.0 mass %. The rate of surface area coverage by the fatty acid and the carbon and oxygen contents in the case of the fatty acid-covered particles may be the same as those in the case of the polysaccharide-covered particles.

Production of the Copper Paste

The copper paste of the present invention may be produced by a process including mixing the copper particles and the solvent, which are described above; and optionally kneading the mixture using a planetary mixer or any other suitable equipment. It is also preferred that, if necessary, a three-roll mill may be used to increase the dispersibility of the copper particles. In this regard, the viscosity of the copper paste may be any suitable level selected depending on the intended use. For example, the viscosity of the copper paste at a shear rate of 1 sec$^{-1}$ and at around room temperature (e.g., at 25° C.) may be 30 Pa·s or more and 2,000 Pa·s or less or 100 Pa·s or more and 1,000 Pa·s or less and especially 150 Pa·s or more and 800 Pa·s or less. In this case, the copper paste is easy to apply uniformly onto a board or other members and can form a sintered copper material with higher levels of thermal conductivity and bonding strength.

Other Components

In addition to the components described above, the copper paste of the present invention may contain a surfactant or dispersing agent including an amine, an antioxidant, a reducing agent, such as hydrazine, glass frit, a binder, such as a resin component, or any other component. Based on the mass of the copper particles, the copper paste may contain approximately 0.05 to 5 mass % of a resin component, such as cellulose resin (e.g., methyl cellulose, ethyl cellulose, carboxymethyl cellulose), acrylic resin, butyral resin, alkyd resin, epoxy resin, or phenolic resin.

Preferably, however, the copper paste of the present invention should be substantially free of any resin component. The presence of a resin component in the copper paste may deteriorate the sintering properties, specifically the sintering properties at 350° C. or less. For example, thermosetting resin such as epoxy resin tends to remain in the sintered product resulting from the sintering of the copper paste. In a case where cellulose resin is used, it should be heated to a temperature of at least 400° C. for its complete thermal decomposition, although it will start to undergo thermal decomposition at around 300° C., and the carbon residue resulting from the thermal decomposition should be removed by firing in an oxygen atmosphere, which may cause the problem of copper particle oxidation. When free of any resin component, the copper paste can be fired at relatively low temperatures in a non-oxidizing atmosphere, which makes it possible to produce a high-density sintered copper material without a reduction in electrical conductivity, which would otherwise be caused by copper particle oxidation. The presence of the second alcohol, which has relatively high viscosity, in the copper paste of the present invention makes it possible to control the viscosity to an appropriate level without using any resin component.

Uses of the Copper Paste

As described above, the copper paste of the present invention provides high electrical conductivity and thermal conductivity and has high storage stability and workability. Moreover, the copper paste of the present invention can be fired at low temperatures in a short time to form a product with high bonding strength. Thus, the copper paste of the present invention is suitable for use in applications for forming wiring in electronic parts, such as power modules, chip resistors, chip capacitors, and solar cells, and suitable for use in applications for forming wiring on boards for mounting electronic parts, such as boards with through holes. For example, the copper paste of the present invention may be applied to a board for mounting power modules, solar cells, or electronic parts, applied to a printed wiring board, or applied to a board with through holes and then fired. The board may be made of silicon, an oxide, such as silicate glass, alumina, or quartz, a nitride, such as silicon nitride or aluminum nitride, a carbide, such as silicon carbide or titanium carbide, or resin, such as polyimide, polyethylene terephthalate, or polyethylene naphthalate. The board may further have a transparent conductive film (TCO) or a metal film on its surface.

Firing of the Copper Paste

The copper paste of the present invention may be fired under any suitable conditions using any suitable method, which may be selected depending on the desired product or the material to which the paste is to be applied. However, the firing of the copper paste of the present invention is preferably preceded by removing the first alcohol by drying. The drying of the copper paste increases the content of the second alcohol in the vicinity of the copper particles to be fired, so that the copper particles will be prevented from oxidation more effectively during the firing. The drying may be performed under any suitable conditions, which may be selected depending on the boiling point of the first alcohol used or the desired product. Preferably, the drying includes heating the copper paste at a temperature of 50 to 200° C., especially at a temperature of 60 to 150° C., for 1 to 60 minutes in the air atmosphere. The drying may be performed under reduced pressure at a lower heating temperature. The drying by heating may also be performed in a reducing atmosphere.

The copper paste of the present invention can be fired at low temperatures in a short time. Therefore, the firing conditions can be selected from various ranges. For example, the copper paste may be fired at a temperature of 150° C. or more and 400° C. or less or a temperature of 200° C. or more and 350° C. or less, especially at a temperature of 250° C. or more and 300° C. or less, for a time period of 10 seconds or more and 60 minutes or less, especially for a time period of 2 minutes or more and 30 minutes or less, in an inert gas atmosphere, such as nitrogen or argon gas, or a reducing gas atmosphere containing 0.1 to 30 vol % of hydrogen, ammonia, carbon monoxide, or an alcohol to form a sintered product with high electrical conductivity, high thermal conductivity, and high strength.

EXAMPLES

Hereinafter, the present invention will be described in more detail with reference to examples, which are not intended to limit the present invention.

Example 1

A copper powder with particle surfaces coated with gum arabic (polysaccharide) (50% particle size: approximately 0.4 μm, carbon content: 0.3 mass %, oxygen content: 0.7 mass %, non-copper metal content: 0.2 mass %), ethylene glycol (first alcohol), and glycerol (second alcohol) were provided and mixed in a mass ratio of 87.0:6.5:6.5 to form a copper paste. As used herein, the term "mass ratio" means the ratio between the masses of the components based on the mass of the copper paste, which is normalized to 100.

Within 2 hours after the preparation, the viscosity ($\eta 0$) of the resulting paste was measured using a dynamic viscoelasticity analyzer (Rheometer manufactured by Brookfield). The viscosity ($\eta 7$) of the paste was also measured after it was stored at 10° C. for 7 days in the air and used to calculate the rate of change in viscosity over time. The rate (%) of change in viscosity was defined as ($\eta 7-\eta 0)/\eta 0 \times 100$.

The paste was applied to a 20 mm-side square area on a glass substrate using a metal mask. After being dried at 60° C. for 5 minutes in the air, the applied paste was fired in a nitrogen atmosphere under a pressure of 20 MPa at 280° C. for 2 minutes using a high-temperature pressing machine to form a copper sintered product with a thickness of approximately 20 μm. The electrical resistivity of the sintered product was measured using a DC four-probe electrical resistivity meter with probe intervals of 1 mm.

The copper paste was also applied with a thickness of 100 μm to a 1 mm-thick copper substrate (instead of the glass substrate). A silicon carbide (SiC) semiconductor chip with a size of 2 mm×2 mm×0.4 mm was then placed on the applied paste. A 500 nm-thick Ti layer and a 500 nm-thick Cu layer had been formed by sputtering on the SiC chip surface to be in contact with the copper paste. The resulting stack was fired in a nitrogen atmosphere under a pressure of 20 MPa at 280° C. for 2 minutes using a high-temperature pressing machine. The product was cooled to room temperature to give a sample. The bonding strength between the SiC chip and the copper substrate in the sample was measured in terms of die shear strength using a die shear tester (DAGE 4000 manufactured by Nordson Corporation).

The result of the measurement was evaluated as acceptable when the rate of change in viscosity was 10% or less, when the electrical resistivity was 5 μΩcm or less, or when the die shear strength was 40 MPa or more. The result that all the measured items were evaluated as acceptable was rated "A", the result that two of the measured items were evaluated as acceptable was rated "B", and the result that only one of the measured items was evaluated as acceptable or all the measured items were evaluated as unacceptable was rated "C". Among the results rated "A", the result that the die shear strength was 70 MPa or more was especially rated "AA".

The results of the measurement and the evaluation are shown in the "Example 1" column of Table 1. The evaluation result was rated "AA".

Examples 2 to 7 and Comparative Examples 1 to 3

Copper pastes were prepared and tested in the same manner as in Example 1 except that the type of the first alcohol was changed. Table 1 shows the results of the measurement and the evaluation together with the type of the first alcohol.

TABLE 1

[Physical properties of first alcohol and copper paste]

| Example | First alcohol Type | Viscosity (mPa · s) | Boiling point (° C.) | Vapor pressure (Pa) | Rate of change in viscosity (%) | Electrical resistivity (μΩ · cm) | Die shear strength (MPa) | Rating |
|---|---|---|---|---|---|---|---|---|
| Example 1 | Ethylene glycol | 16 | 197 | 20 | 4 | 3.2 | 89 | AA |
| Example 2 | Diethylene glycol | 30 | 245 | 0.1 | 6 | 5.8 | 54 | B |
| Example 3 | Hexylene glycol | 34 | 197 | 19 | 6 | 3.8 | 53 | A |
| Example 4 | 1,2-Propanediol | 36 | 188 | 28 | 5 | 3.8 | 67 | A |
| Example 5 | 1,3-Propanediol | 47 | 214 | 5 | 8 | 4.3 | 71 | A |
| Example 6 | Triethylene glycol | 49 | 285 | 0.2 | 4 | 5.8 | 41 | B |
| Example 7 | 2,3-Butanediol | 45 | 182 | <100 | 6 | 4.8 | 54 | A |

TABLE 1-continued

[Physical properties of first alcohol and copper paste]

| | First alcohol | | | | Rate of change in viscosity (%) | Electrical resistivity (μΩ · cm) | Die shear strength (MPa) | |
|---|---|---|---|---|---|---|---|---|
| Example | Type | Viscosity (mPa · s) | Boiling point (° C.) | Vapor pressure (Pa) | | | | Rating |
| Comparative Example 1 | Ethanol | 1.1 | 78 | 5800 | 35 | 7.1 | 38 | C |
| Comparative Example 2 | 2-Propanol | 2.1 | 82 | 4440 | 29 | 6.9 | 34 | C |
| Comparative Example 3 | 1,4-Butanediol | 71 | 235 | <10 | 15 | 6.1 | 28 | C |

Examples 1 to 7, in which the first alcohol with a viscosity in the range of 3 mPa·s or more and 70 mPa·s or less was used in combination with the second alcohol according to the present invention, provided good results, which were rated "AA", "A", or "B" according to the criteria shown above. In particular, Examples 1, 3 to 5, and 7, in which the first alcohol used had a boiling point of 150° C. or more and 240° C. or less and a vapor pressure of 3 Pa or more and 30 Pa or less at 20° C., provided better results, which were rated "AA" or "A".

Example 8

The experiment shown in Table 1 was performed in the same manner except that decanoic acid (a fatty acid) was used instead of gum arabic (polysaccharide) to form a coating layer on the surface of the copper particles. The evaluation result was rated at the same level as shown in Table 1 except that within 2 hours after the preparation, the resulting copper paste had a viscosity approximately 8 to 25% lower than that of the copper paste produced with gum arabic-coated copper particles and that the copper paste was applied with a thickness of approximately 60 to 85 μm.

This indicates that not only a polysaccharide but also a medium chain fatty acid are useful for coating the surface of the copper particles.

Example 9 and Comparative Examples 4 and 5

Copper pastes were prepared and tested under the same conditions as in Example 1 except that the type of the second alcohol was changed while ethylene glycol was used as the first alcohol. Table 2 shows the results.

TABLE 2

[Physical properties of second alcohol and copper paste]

| | Example 1 | Example 9 | Comparative Example 4 | Comparative Example 5 |
|---|---|---|---|---|
| Second alcohol | Glycerol | 2-Ethyl-1,3-hexanediol | 1,3-Propanediol | Triethylene glycol |
| Viscosity (mPa · s) | 934 | 323 | 47 | 49 |
| Boiling point (° C.) | 290 | 244 | 214 | 285 |
| Vapor pressure (Pa) | 0.01 | <1.4 | 5 | 0.2 |
| Rate of change in viscosity (%) | 4 | 7 | 8 | 4 |
| Electrical resistivity (μΩ · cm) | 3.2 | 4.7 | 5.9 | 5.8 |
| Die shear strength (MPa) | 89 | 56 | 24 | 28 |
| Rating | AA | A | C | C |

Examples 1 and 9, in which a dihydric or trihydric alcohol with a viscosity of 300 mPa·s or more and 1,000 mPa·s or less was used as the second alcohol according to the present invention, provided good results, which were rated "AA" or "A". On the other hand, Comparative Examples 4 and 5, in which the alcohol used had a viscosity out of the above range, provided "C"-rated results. This suggests that the better results of Examples 1 and 9 should be due to the use of the second alcohol with a boiling point of at least 240° C. Example 1, in which glycerol (with a vapor pressure of at most 1 Pa at 20° C.) was used, provided a particularly good result, which was rated "AA".

Examples 10 to 13 and Comparative Examples 6 and 7

Copper pastes were prepared and tested under the same conditions as in Example 1 except that the mass ratio (X/Y) of the first alcohol (ethylene glycol) to the second alcohol (glycerol) was changed. Table 3 shows the results. The acceptance criteria for the results in Table 3 are the same as those for the results in Tables 1 and 2, except that two items are evaluated in Table 3 and that the result that the two items were all evaluated as acceptable was rated "A" and the result that one or both of the two items were evaluated as unacceptable was rated "C". The criteria for the rating "AA" shown in Table 3 are the same as those for the rating "AA" shown in Tables 1 and 2.

TABLE 3

[Mass ratio (X/Y) of first alcohol to second alcohol and physical properties of copper paste]

|  | Comparative Example 6 | Example 10 | Example 11 | Example 1 | Example 12 | Example 13 | Comparative Example 7 |
|---|---|---|---|---|---|---|---|
| X/Y | 0/1 | 1/5 | 1/2 | 1/1 | 5/1 | 8/1 | 10/1 |
| Electrical resistivity (μΩ · cm) | 3.5 | 3.5 | 3.2 | 3.2 | 4.2 | 4.3 | 4.3 |
| Die shear strength (MPa) | 28 | 54 | 77 | 89 | 81 | 63 | 28 |
| Rating | C | A | AA | AA | AA | A | C |

It was found that when X/Y was 0.2 (1/5) or more and 8 (8/1) or less, good results rated "AA" or "A" were obtained with respect to electrical resistivity and die shear strength. In particular, when X/Y was 0.5 (1/2) or more and 5 (5/1) or less, the die shear strength was at least 70 MPa, which was a very high level and rated "AA" (a better result).

Examples 14 to 17 and Comparative Examples 8 to 11

The same procedure was performed as in Example 1 except that the carbon and oxygen contents of the gum arabic-coated copper particles were changed as shown in Table 4 and that the metal impurity content of the copper powder was 0.2 mass %. Table 4 shows the composition of each of the resulting copper pastes and the test results.

TABLE 4

[Carbon and oxygen contents of gum arabic-coated copper particles and physical properties of copper paste]

| Example | Gum arabic-coated copper particles | | Rate of change in viscosity (%) | Electrical resistivity (μΩ · cm) | Die shear strength (MPa) | Rating |
|---|---|---|---|---|---|---|
|  | Carbon content* | Oxygen content* |  |  |  |  |
| Comparative Example 8 | 0.01 | 0.025 | −18 | 3.1 | 42 | B |
| Comparative Example 9 | 0.04 | 0.03 | −12 | 3.1 | 39 | C |
| Example 14 | 0.05 | 0.06 | −5 | 3.3 | 47 | A |
| Example 15 | 0.1 | 0.2 | 2 | 3.2 | 69 | A |
| Example 16 | 0.3 | 0.7 | 6 | 3.2 | 87 | AA |
| Example 17 | 0.8 | 1.5 | 9 | 3.9 | 68 | A |
| Comparative Example 10 | 1.0 | 1.8 | 19 | 4.8 | 36 | C |
| Comparative Example 11 | 1.2 | 2.1 | 27 | 5.8 | 32 | C |

*Units: mass % based on the mass (100 mass %) of copper particles with gum arabic coating layer Each of the copper pastes provided a die shear strength of more than 30 MPa. The copper powder with lower carbon and oxygen contents tended to form a paste with lower viscosity. On the other hand, as the carbon and oxygen contents increased, the paste viscosity tended to increase. Examples 14 to 17, in which coated copper particles with a carbon content of 0.05 to 0.8 mass % and an oxygen content of 0.05 to 1.5 mass % were used, were found to provide a low electrical resistivity of less than 4 μΩcm and a high die shear strength of more than 40 MPa.

As described above, the copper paste of the present invention has high storage stability and provides high electrical conductivity and high bonding strength. In addition, the copper paste of the present invention exhibits good oxidation resistance, provides high thermal conductivity, and is capable of being fired at low temperature in short time.

The invention claimed is:

1. A copper paste comprising: copper particles; and an organic solvent, wherein:
   the organic solvent is an alcohol-based solvent comprising:
      at least one first alcohol selected from the group consisting of 1-hexanol, 1-heptanol, 2-heptanol, 2-octanol, 2-ethyl-1-hexanol, benzyl alcohol, hexylene glycol, 1,2-propanediol, 1,3-propanediol, and ethylene glycol; and
      at least one second alcohol selected from the group consisting of dihydric and trihydric alcohols having a viscosity of 300 mPa·s or more and 1,000 mPa·s or less at 20° C.; and
   the copper particles have a coating layer on at least a part of their surface, wherein the coating layer comprises a polysaccharide, nonanoic acid, decanoic acid, dodecanoic acid, tetradecanoic acid, or a mixture thereof.

2. The copper paste according to claim 1,
   wherein the first alcohol has a boiling point of 150° C. or more and 240° C. or less at atmospheric pressure,
   wherein the second alcohol has a boiling point of 190° C. or more and 320° C. or less at atmospheric pressure, and
   wherein the boiling point of the first alcohol is lower than that of the second alcohol.

3. The copper paste according to claim 2, wherein the organic solvent has a ratio (X/Y) of the mass (X) of the first alcohol to the mass (Y) of the second alcohol of 0.2 or more and 8.0 or less.

4. The copper paste according to claim 3,
   wherein the second alcohol is at least one alcohol selected from the group consisting of 2-ethyl-1,3-hexanediol and glycerol.

5. The copper paste according to claim 2,
   wherein the second alcohol is at least one alcohol selected from the group consisting of 2-ethyl-1,3-hexanediol and glycerol.

6. The copper paste according to claim 1, wherein the organic solvent has a ratio (X/Y) of the mass (X) of the first alcohol to the mass (Y) of the second alcohol of 0.2 or more and 8.0 or less.

7. The copper paste according to claim 6,
   wherein the second alcohol is at least one alcohol selected from the group consisting of 2-ethyl-1,3-hexanediol and glycerol.

8. The copper paste according to claim 1, wherein the second alcohol is at least one alcohol selected from the group consisting of 2-ethyl-1,3-hexanediol and glycerol.

9. The copper paste according to claim 1, wherein the copper paste is free of any resin component.

10. The copper paste according to claim 1, wherein the copper particles having the coating layer contain 0.05 mass % or more and 0.8 mass % or less of carbon and 0.05 mass % or more and 1.5 mass % or less of oxygen based on 100 mass % of the copper particles.

11. A copper paste comprising: copper particles; and an organic solvent, wherein:
 the organic solvent is an alcohol-based solvent comprising:
  at least one first alcohol selected from the group consisting of hexylene glycol, 1,2-propanediol, 1,3-propanediol, 2,3-butanediol, triethylene glycol, diethylene glycol, and ethylene glycol; and
  at least one second alcohol selected from the group consisting of dihydric and trihydric alcohols having a viscosity of 300 mPa·s or more and 1,000 mPa·s or less at 20° C.; and
 the copper particles have a coating layer on at least a part of their surface, wherein the coating layer comprises a polysaccharide, nonanoic acid, decanoic acid, dodecanoic acid, tetradecanoic acid, or a mixture thereof.

12. A copper paste comprising: copper particles; and an organic solvent, wherein:
 the organic solvent is an alcohol-based solvent comprising:
  at least one first alcohol selected from the group consisting of monohydric and dihydric alcohols having a viscosity of 3 mPa·s or more and 70 mPa·s or less at 20° C.; and
  at least one second alcohol selected from the group consisting of dihydric and trihydric alcohols having a viscosity of 300 mPa·s or more and 1,000 mPa·s or less at 20° C.; and
 the copper particles have a coating layer on at least a part of their surface, wherein the coating layer comprises a polysaccharide.

13. The copper paste according to claim 12, wherein the copper particles having the coating layer contain 0.3 mass % or more and 0.8 mass % or less of carbon based on 100 mass % of the copper particles having the coating layer.

* * * * *